(12) United States Patent
Liepack et al.

(10) Patent No.: US 11,332,819 B2
(45) Date of Patent: May 17, 2022

(54) HOLDING DEVICES FOR RECEIVING A PLURALITY OF SUBSTRATES FOR THE TREATMENT THEREOF, TREATMENT SYSTEMS, AND TREATMENT METHODS

(71) Applicant: Solayer GmbH, Kesselsdorf (DE)

(72) Inventors: Harald Liepack, Dresden (DE); Thomas Merz, Aschaffenburg (DE); Sebastian Wissel, Karlstein (DE); Andreas Rack, Grosskrotzenburg (DE)

(73) Assignee: Solayer GmbH, Kesselsdorf (DE)

( * ) Notice: Subject to any disclaimer, the term of this patent is extended or adjusted under 35 U.S.C. 154(b) by 114 days.

(21) Appl. No.: 16/405,699

(22) Filed: May 7, 2019

(65) Prior Publication Data
US 2019/0345601 A1  Nov. 14, 2019

(30) Foreign Application Priority Data
May 9, 2018 (DE) .......................... 102018111247.5

(51) Int. Cl.
*C23C 14/50* (2006.01)
(52) U.S. Cl.
CPC .................................. *C23C 14/50* (2013.01)
(58) Field of Classification Search
CPC ... C23C 14/50; C23C 16/458; C23C 16/4582; H01J 2237/201; H01L 21/67313; H01L 21/67316; H01L 21/67326; H01L 21/6733; H01L 21/67333; H01L 21/67336; H01L 21/67712; H01L 21/68771; H01L 21/68778
See application file for complete search history.

(56) References Cited

U.S. PATENT DOCUMENTS

| | | | | |
|---|---|---|---|---|
| 3,396,696 A | * | 8/1968 | Becker | C23C 14/505 118/731 |
| 3,799,110 A | * | 3/1974 | Bellmann | C23C 14/505 118/731 |
| 4,817,559 A | * | 4/1989 | Ciparisso | C23C 14/505 118/731 |
| 4,849,250 A | * | 7/1989 | Dee | C23C 14/50 427/599 |
| 5,911,830 A | * | 6/1999 | Chakrabarti | C23C 14/50 118/503 |
| 6,171,462 B1 | * | 1/2001 | Gries | C23C 14/50 118/500 |
| 8,356,808 B2 | * | 1/2013 | Macionczyk | C23C 14/505 269/58 |

(Continued)

OTHER PUBLICATIONS

European Patent Office, European Search Report for related European Patent Application No. 19173443.3, dated Oct. 2, 2019.

*Primary Examiner* — Aiden Lee
(74) *Attorney, Agent, or Firm* — Dascenzo Gates Intellectual Property Law, P.C.

(57) ABSTRACT

Holding devices for receiving a plurality of substrates in a substrate treatment system are disclosed. Holding devices comprise a flange, at least one segment that is releasably disposed on the flange, and at least one carrier for receiving one or a plurality of substrates. The flange has connection faces for disposing the at least one segment on the flange. The at least one segment has a segment support structure. The at least one carrier is assembled on the segment support structure.

21 Claims, 5 Drawing Sheets

(56) References Cited

U.S. PATENT DOCUMENTS

| | | | |
|---|---|---|---|
| 8,561,276 B2* | 10/2013 | Tsai | C23C 14/50 |
| | | | 29/281.1 |
| 2012/0186522 A1 | 7/2012 | Adachi et al. | |
| 2013/0074767 A1* | 3/2013 | Jiang | C23C 14/505 |
| | | | 118/500 |
| 2018/0144962 A1* | 5/2018 | Lin | H01L 21/687 |
| 2019/0295880 A1* | 9/2019 | Krishnan | H01L 21/67248 |

* cited by examiner

HOLDING DEVICES FOR RECEIVING A PLURALITY OF SUBSTRATES FOR THE TREATMENT THEREOF, TREATMENT SYSTEMS, AND TREATMENT METHODS

RELATED APPLICATION

This application claims priority under 35 U.S.C. § 119 to German Patent Application No. 10 2018 111 247.5, which was filed on May 9, 2018, the complete disclosure of which is incorporated herein by reference.

FIELD

The present disclosure relates to holding a plurality of substrates for the treatment thereof.

BACKGROUND

A treatment system for treating substrates according to the conventional type comprises a system chamber or a sequence of a plurality of system chambers in which the substrates, held by a suitable holding device, are transported and are exposed to the action of at least one substrate treatment installation. The substrate treatment herein takes place under a special process atmosphere, often under a vacuum, in the case of a gas or gas mixture being admitted in a controlled manner.

A space which is enclosed by chamber walls is usually referred to as a "chamber", said space being delimited in relation to the surrounding space and optionally being capable of being closed by vacuum technology. A treatment plant can have one or more treatment chambers, depending on the scope of the treatments and on the size of the substrate. A treatment chamber can comprise a single treatment section or can itself in turn be subdivided into a plurality of sections that can be differentiated in terms of function.

Most varied, often flat, substrates, for example for the production of semiconductor structural elements, for architectural or photovoltaic applications, optical glasses, and others, are subjected to various treatments. A treatment here is to be understood to be the known modifying, additive and subtractive treatments, that is to say processes in which the substrate, or layers present on the substrate, is/are modified in structural or energetic terms, material is deposited on the substrate or is removed from the substrate.

Apart from the substrate coating, for example by means of physical vacuum coating, using different layers and layer systems, plasma treatments or sputter etching are inter alia commonplace substrate treatment methods. The treatment is typically performed in conjunction with further method steps, wherein large volumes and a high efficiency in terms of the treatment are typically required for the industrial application. Treatment plants of this type are known as continuous plants or as cluster plants.

During the treatment, the substrates to be coated are held by holding devices which can receive one or a plurality of substrates for simultaneous treatment. Holding devices of this type are embodied such that the face to be treated is not covered or is covered only to a minor extent, and the substrates in a simple manner can be fed, also in an automated manner and without damaging the face to be coated or the face already coated, respectively, be treated, and be retrieved after the treatment. Said holding devices also serve for transporting the substrates in the treatment plant.

The transporting can be performed by a translatory movement, a rotary movement, or a movement along another defined movement path. Depending on the type of movement, different forces can act on the substrates, said forces having to be absorbed by the holding device in order to guarantee precise and reproducible positioning of the substrates for the treatments.

The holding devices often comprise so-called carriers which are capable of being retrieved from the holding device and capable of being fed to the holding device, and herein receive one substrate or a plurality of the latter. The carriers in terms of the shape thereof are adapted substantially to the design of the substrates. Moreover, said carriers are adapted to the handling to be carried out, such as, for example, transferring the substrates between the magazine and the treatment plant, aligning the substrate, and other measures known in treatment plants.

When a change of substrate types or substrate sizes is performed in a treatment plant, a change of the carriers and thus a change or a modification of the holding device is consequently required, extensive conversion measures and downtimes of the plant being associated therewith. Said disadvantages can indeed be reduced when a holding device is conceived for different substrate types and/or substrate sizes. However, the face that is utilizable for the simultaneous treatment of substrates is often decreased.

There is therefore a requirement for holding devices which are adaptable to different substrate types and substrate sizes and herein permit improved utilization of the treatment face. The holding device is simultaneously to be utilizable for the automatic handling of the substrates in the treatment plants.

There exists in particular an interest in a rotatable holding device in which high rotating speeds and thus high forces and moments also occasionally arise.

SUMMARY

Holding devices for receiving a plurality of substrates for the treatment thereof, treatment systems, and treatment methods are disclosed. In some examples, the treatment systems include a holding device according to the present disclosure. In some examples, the treatment methods utilize holding devices according to the present disclosure.

In one or more examples, a holding device comprises a flange, at least one segment that is releasably disposed on the flange, and at least one carrier for receiving one or a plurality of substrates. The flange has connection faces for disposing the at least one segment on the flange. The at least one segment has a segment support structure. The at least one carrier is assembled on the segment support structure.

In one or more examples, a treatment system comprises at least one treatment chamber having at least one treatment section, and a substrate transport device, configured for moving substrates in the treatment system. The substrate transport device comprises a holding device according to the present disclosure.

In one or more examples, a method for treating substrates in a treatment system according to the present disclosure comprises providing substrates to be treated; disposing the substrates on the at least one carrier; assembling the at least one carrier, equipped with the substrates, on the segment support structure; moving the segment support structure and the at least one carrier, equipped with the substrates, into the treatment chamber; treating the substrates; and moving out the at least one segment and/or the at least one carrier having the treated substrates from the treatment chamber.

DESCRIPTION

Figure 1:
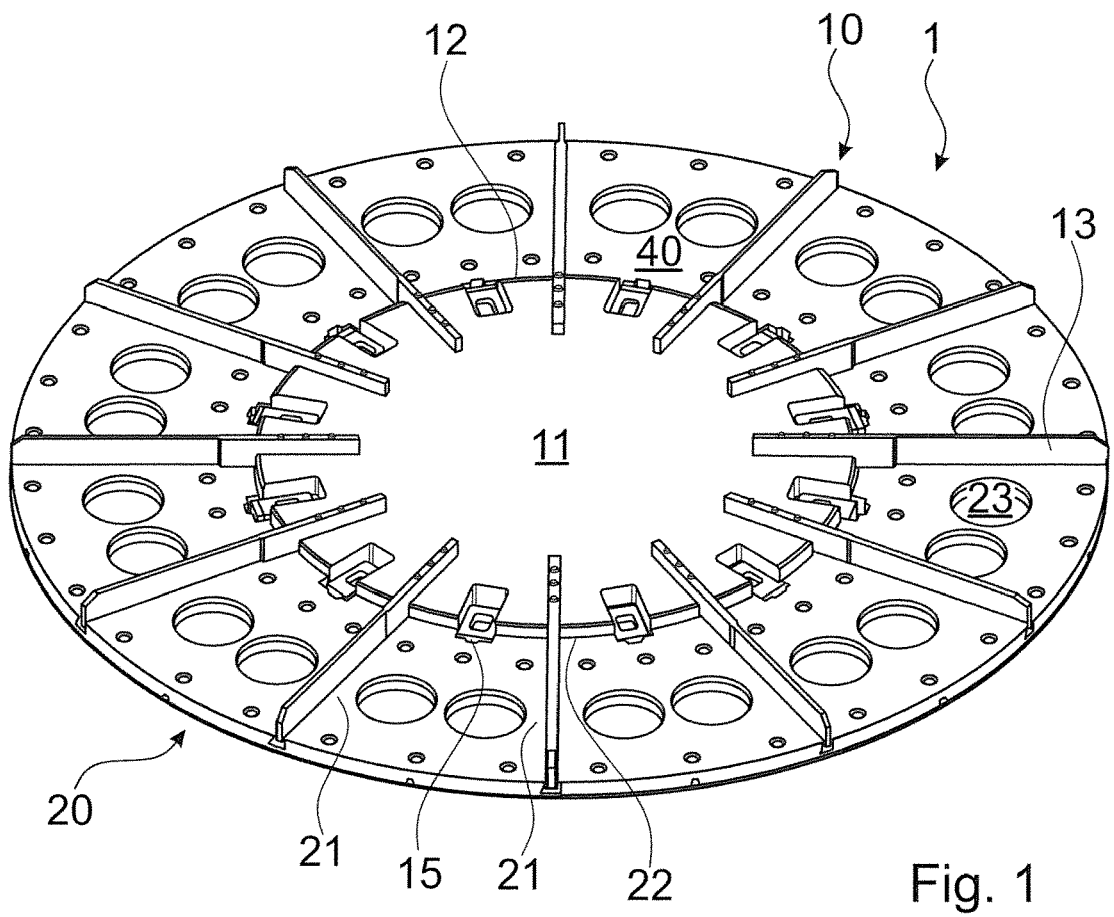
FIG. 1 is a perspective view of an example of a holding device according to the present disclosure.

Holding devices for receiving a plurality of substrates for the treatment thereof, treatment systems, and treatment methods are disclosed. The holding devices and treatment systems of the present disclosure have components that may be standardized for receiving carriers for substrates. In particular, interfaces that serve primarily for absorbing and transmitting forces are disclosed and may be standardized, and interfaces that facilitate the receiving of substrates of dissimilar designs are disclosed and may be standardized. Accordingly, the component parts of holding devices of the present disclosure may be handled in an automated manner, as are carriers for substrates.

Interfaces therefore may be devised for the optimal mounting of components to be received as well as for the frequent loading and unloading of the holding device with substrates. Loading and magazine systems, which are independent of the formats of the carriers and substrates, are usable for the loading of the holding device in a treatment plant. An optimal mounting thus includes both the connection faces and connection hardware required for the fixing and the force transmission, as well as the utilization of said connection faces and connection hardware in a manner capable of being automated in the course of one complete batch size.

A mounting of the substrates, which covers the faces to be treated of said substrates to a minimal extent, in terms of the holding device according to the present disclosure, is to be considered only as from the substrate mounting by the carriers.

Features used for implementing the concepts of the present disclosure are described herein. Said features may be combined differently with one another in different embodiments, such as may be expedient and suitable for a specific application.

Holding devices according to the present disclosure comprise a flange on which one segment or a plurality of segments is disposed, and in which the segments have carriers. The disposal of the segments on the flange is performed by connection faces, which in terms of size, position, and distribution, are adapted to the segment to be received and to the forces to be expected, which act on the connection faces. Such an adaptation in terms of construction is performed by tests or computer-aided simulation.

The part of the holding device that is capable of being received by a transport device of a treatment plant and that is usable for transmitting the forces of the transport device to the holding device is referred to herein as a flange. Other elements of the holding device ultimately serve for transmitting the forces of the transport device to the substrates, in order for the latter to be moved and positioned in the course of the treatment.

Depending on the type and size of the substrates, the design of the treatment plant, and movements to be carried out, the flange can have various shapes. The flange may be axially symmetrical, rotationally symmetrical, or any other asymmetrical design, and may comprise further components.

The segment or the segments, depending on the type and the position of the connection faces, may be loosely connected to the flange or may be fastened to the flange so as to be non-destructively releasable on the flange. Accordingly, the connection faces may be embodied in various ways. A loose placement is possible, for example, by way of horizontal connection faces that are configured on the flange or that are provided by way of suitable supports, such as T-supports, I-supports, or other shapes of supports. A releasable fastening is possible by way of suitable fastening hardware in the case of releasable and other connection faces.

The mounting and/or fastening of the segments on the flange can be implemented by suitable holding structure which only holds, simultaneously holds and fastens, or which has mutually separated structures for holding and for fastening. Accordingly, the holding structure can be configured on the flange and/or on the segments. The holding structure is configured in such a manner that said holding structure permits retrieving and fastening of the segments by way of an (optionally remotely-controllable) handling system. Such holding structures can, inter alia, be configured as mechanical snap-fit systems, magnetic or electrically operable mountings, or be configured in another way.

The segments comprise a segment support structure and at least one carrier that is assembled on the segment support structure directly or by way of further elements. Such designs (e.g., in the sense of a frame, support, framework, or similar) are suitable for holding the carrier or carriers equipped with substrates in the course of the treatment and the movement of the carriers are understood to be a segment support structure. The further elements may be suitable holding structure, brackets, or other structures that facilitate the assembly of the carriers or the receptacle of the substrates by way of minimum coverage, for example.

The releasable connection of the segments to the flange is performed by the segment support structure. For this purpose, the holding structure or parts thereof can be configured on the segment support structure.

A carrier (e.g., a plate-shaped element) or a plurality thereof is assembled on the segment support structure. The embodiment of said carrier for mounting the substrates to be treated is adapted to the design of said substrates.

The carrier also may be configured in multiple parts, depending on various parameters such as the size and the design of a segment and/or the size and the design of a substrate. In this design embodiment, a carrier component can be a mounting, for example a holding frame or others that is releasable from the carrier and that improves the handling of small or thin or high volumes of substrates, for example.

A connection location in a manner analogous to that between the flange and the segment support structure optionally may be configured between the segment support structure and the carrier, or between two carrier components, such that a retrieval of a carrier holding a substrate, or of a carrier component, is possible (as has been described above) by a handling system of the treatment device. Such a connection location may be inserted as a further standardized interface. The handling of the substrates held by the carrier or the carrier component is optimized and capable of automation in this case. Moreover, the advantage of the simple adaptation of the holding device by replacing the segments as has been described above when changing the substrate design may be continued to be utilized also in such design embodiments.

The carrier may be connected loosely to the segment support structure or by suitable further holding structure, which also is operable in an automated manner and may be fastened so as to be non-destructively releasable on the segment support structure. The connection between the carrier and the segment support structure depends inter alia on the design and the size of the substrates, on the forces that arise in the movement of the substrates in the treatment plant, as well as on the location of the replacement of the carriers, that is to say whether the replacement within the treatment plant takes place during the ongoing operation. The carrier is configured for receiving one or a plurality of substrates.

The structured design of the holding device, subdivided into a flange, retrievable segments, and the embodiment of the holding device from a segment support structure and releasable carriers, permits the use of one holding device for substrates which vary in terms of shape, thickness, and size. Different substrates having mutually deviating geometry can be simultaneously held in one holding device.

The carrier face, by way of the replaceable carriers that are capable of having variable design and are optionally in multiple parts, may be utilized in an optimal manner for receiving substrates. The substrate face, which is capable of being simultaneously treated, may be increased as compared to the prior art.

The segment support structure, in conjunction with the said holding structure, forms the interface between the flange and the carrier. Said interface is capable of being standardized when segments have different carriers but uniform segment support structures and uniform holding structure. As a result of the retrievability of the segments, other segments equipped with suitable carriers may be used in the case of a substrate change, without any time-consuming conversion of the holding device being necessary. The handling and magazine systems of the treatment plant may be continued to be used for the modified segments. Entering the segments into a vacuum plant and evacuating the segments therefrom is also possible in this way.

The same also may apply to the carrier or the carrier component in conjunction with the holding structure thereof for the releasable assembly of the carriers or carrier component, when the connection location of said carriers or carrier component to the segment support structure, or to the neighboring carrier component, respectively, is configured in an analogous manner.

The retrievability of the segments and optionally of the carriers or carrier components moreover permits those parts of the holding device, which as a result of the treatment, in particular the coating, have a higher maintenance requirement to be regularly retrieved and replaced. This is facilitated by a design of the segment support structures and/or the carriers that have shield portions. Said shield portions may be suitable projections and recesses in the peripheral region of the segment and are disposed such that said projections and recesses cover particular components of the holding device that are exposed to the treatment of the substrates, that is to say act as a shield. For example, the carrier may cover the holding structure, the fastening hardware, and parts of the flange. A multiple cover for configuring a labyrinth-like system of shields by way of which stray vapor may be shielded, for example, also is possible.

A treatment plant for treating substrates, which comprises a holding device according to the description above typically has a treatment chamber having at least one treatment section, for example, a coating section, or a plurality of such treatment chambers. Further chambers and sections that serve for the pre-treatment and/or post-treatment of the substrates as well as for the production of the process conditions required for the treatment are in most instances likewise required and depend on the type of treatment.

In order for the substrates to be able to pass the one or a plurality of sections, the treatment plant also has a substrate transport device as has been described at the outset in the context of the prior art. Said substrate transport device moves the afore-described holding device having the substrates disposed thereon in the manner required for the treatment. In terms of the types of movement to be considered, reference is made to the explanations in the Background, above.

A method for treating substrates that uses the afore-described treatment plant, apart from the generic method steps such as, for example, producing and maintaining the process atmosphere, preparing and/or pre-treating the substrates and others, comprises the following method steps: (i) The substrates to be treated are first provided. As has been described above in the context of the holding device, said substrates determine the design of the carriers and optionally also the fastening of the latter to the segment support structure as well as the mounting of the segment on the flange. (ii) Accordingly, segments of the afore-described holding device are provided, said segments receiving carriers which are suitable for holding the substrates during substrate transporting and treatment. (iii) The substrates are disposed by a suitable handling system, optionally also manually, on the carriers. (iv) The carriers equipped with the substrates are assembled on the segment support structure. The latter does not mandatorily include special fastening hardware. The assembly requires only for the position of the carriers during the treatment to be and remain defined. This can be performed, for example, with guide rails, positioning pins, or similar simple mechanical auxiliary means, or by means of other additional components of the segments. (v) The segment support structures and the carriers equipped with substrates are introduced into the treatment plant and are assembled on the holding device of the treatment plant as has been described above. (vi) The treatment of the substrates held by the segments is performed in the treatment plant. If required, said substrates by means of the holding device and a suitable transport device of the treatment plant are moved in the plant, optionally through the plant, and are sequentially subjected to different method steps. (vii) The segments, optionally only the carriers, having the treated substrates are moved out of the treatment plant after the completion of the treatment.

The order of the afore-described method steps can deviate from one another so as to correspond to the design embodiment of the connection locations between the segment and the flange, between the carrier and the segment support structure, or between the carrier components.

In one embodiment, moving the substrates into the treatment plant can be performed when said substrates, by way of the carriers, are already disposed on the segment support structure so that a fully equipped segment is introduced into the treatment plant.

In an alternative embodiment, moving the substrates into the treatment plant can be performed when said substrates are held by the carriers and the segment support structures are already situated in the plant. In this case, the segment support structures for a simple adaptation of the holding device to new substrate geometries can be replaced (in an automated manner), and/or a change between the two variants can be performed for moving in the substrate.

The concept of the segment support structure as an interface capable of being standardized facilitates both variants, wherein a standardized interface that is optionally operable in an automated manner also may be configured between the carrier and the segment support structure.

Magazines that receive a multiplicity of the respective objects and are loaded and unloaded in an automated manner may be used for the substrates and/or for the carriers and/or for the equipped segments in the method design embodiments mentioned.

For improved understanding, an illustrative, non-exclusive example is now described of an embodiment of the holding device that is configured in a rotationally symmetrical manner as a rotating plate. For treating the substrates that are held by the rotary plate, for example for coating said substrates, rotary plates of this type are continuously rotated at a high speed for a homogenous coating. The flange for such a design embodiment may be configured as a circular plate on which radially disposed supports, for example T-supports, are assembled. Said supports may protrude beyond the periphery of the plate and receive segments in the form of annular segments. The segments may bear on the horizontally lying profiled parts of the T-supports, for example, and may be releasably fastened for fixing the segments to the T-supports.

The features implemented above in the various design embodiments of the present disclosure and in the embodiment described hereunder may be modified or combined by a person skilled in the art for other applications and further embodiments in as far as this is deemed expedient and meaningful to said person skilled in the art.

The figures described hereunder serve only for explaining features of an example embodiment. Said figures do not represent any claim in terms of completeness and scale.

A holding device 1 configured as a rotary plate in FIG. 1 comprises a flange 10 having a support plate 11 that, in the exemplary embodiment, is configured as a circular support plate 11. Twelve supports 13 run in a radially outward manner, protrude beyond the periphery 12 of the support plate 11, and are fastened to the support plate 11. The supports 13 are configured, for example, as T-profile supports, the crossbeams 14 (FIG. 2) thereof forming the lower end of the supports.

Twelve annular-segment-shaped segments 20 of identical type are disposed between the supports 13 so as to directly adjoin the periphery 12 of the support plate 11. Each segment 20 in a carrier 40 thereof has two circular openings 23 that, in a suitable manner, are configured for receiving circular substrates (not illustrated). The segments 20 in both lateral peripheral regions 21 thereof bear on the crossbeam 14 of, in each case, one support 13. The supports 13 in an exemplary manner protrude beyond the periphery 12 of the support plate 11 by way of such a length that said supports 13 terminate so as to be flush with the segments 20. The components of the segments 20 and bearings in the lateral peripheral region 21 are illustrated in detail in FIG. 4 and are described in the context of the latter.

Figure 2:
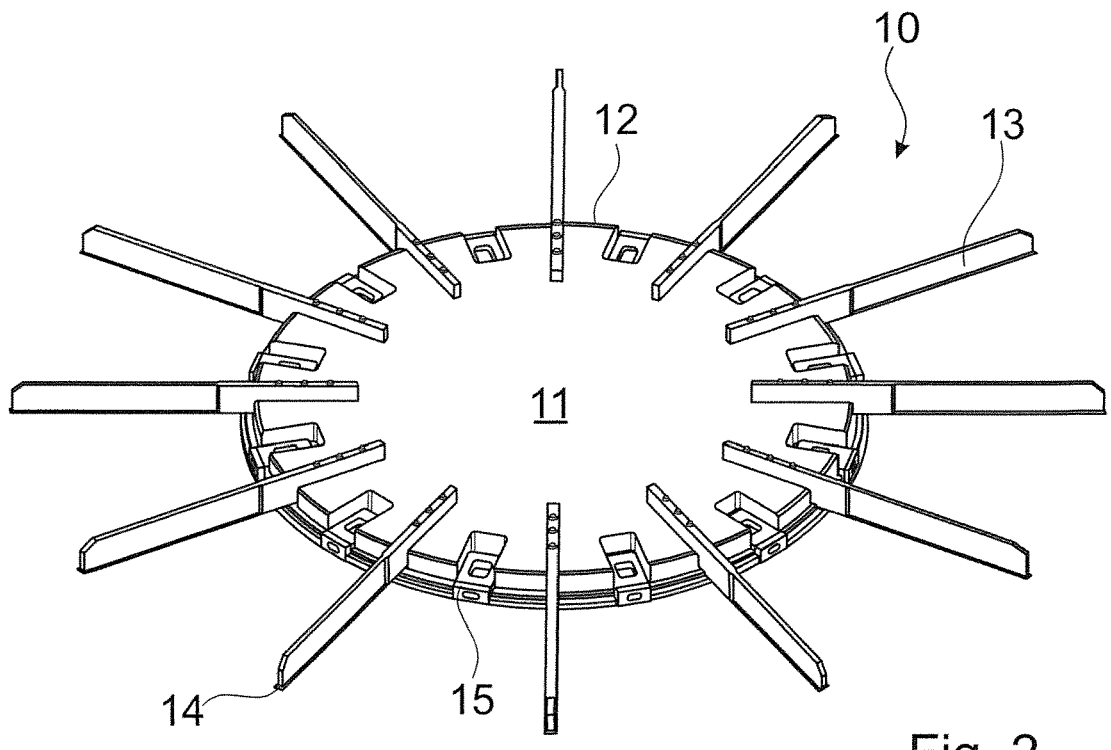
FIG. 2 is a perspective view of the flange of the holding device of FIG. 1.

FIG. 2 shows the support plate 11 having the supports 13 and holding structures 15 without segments 20. It can be derived from FIG. 1 and FIG. 2 that the support plate 11 has suitable holding structure 15 neighboring the internal peripheral region 22 of each of the segments 20, said holding structure 15 in the "closed" state holding the segment 20 in the radial position illustrated in FIG. 1 and being capable of at least being opened in a remote-controlled manner, optionally also being capable of being closed in a remote-controlled manner.

Figure 3:
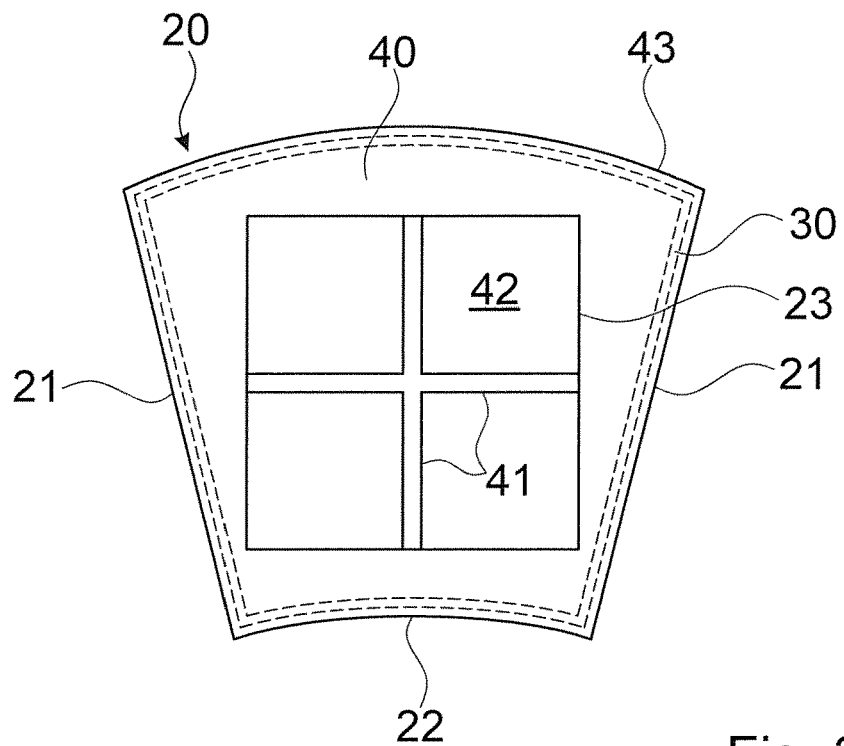
FIG. 3 is a plan view of an alternative segment of the holding device of FIG. 1.

FIG. 3 shows an alternative embodiment of a segment 20 which has the same dimensions, the same external shape, and the same bearings in the lateral peripheral region 21 as the embodiment from FIG. 1 and consequently is capable of being used as an alternative to the latter in the holding device of FIG. 1. The segment 20 of FIG. 3 comprises a segment support structure 30 that is configured in the form of a segment frame, on which a plate-shaped element 43 is assembled such that the latter covers the segment support structure 30 at least on one side. The plate-shaped element 43 forms the carrier 40. The carrier 40 centrically has a quadrangular opening 23 which by webs 41 is subdivided into four carrier openings 42. Each carrier opening 42 is configured for receiving a rectangular substrate (not illustrated). The segment 20 from FIG. 3 differs from that from FIG. 1 only in terms of the shape of the opening 23 so that reference is furthermore made to the explanations pertaining to FIG. 1. Other geometries instead of the rectangular or round substrate shapes shown in the figures also may be disposed by way of the segments 20 in the holding device.

Figure 4:
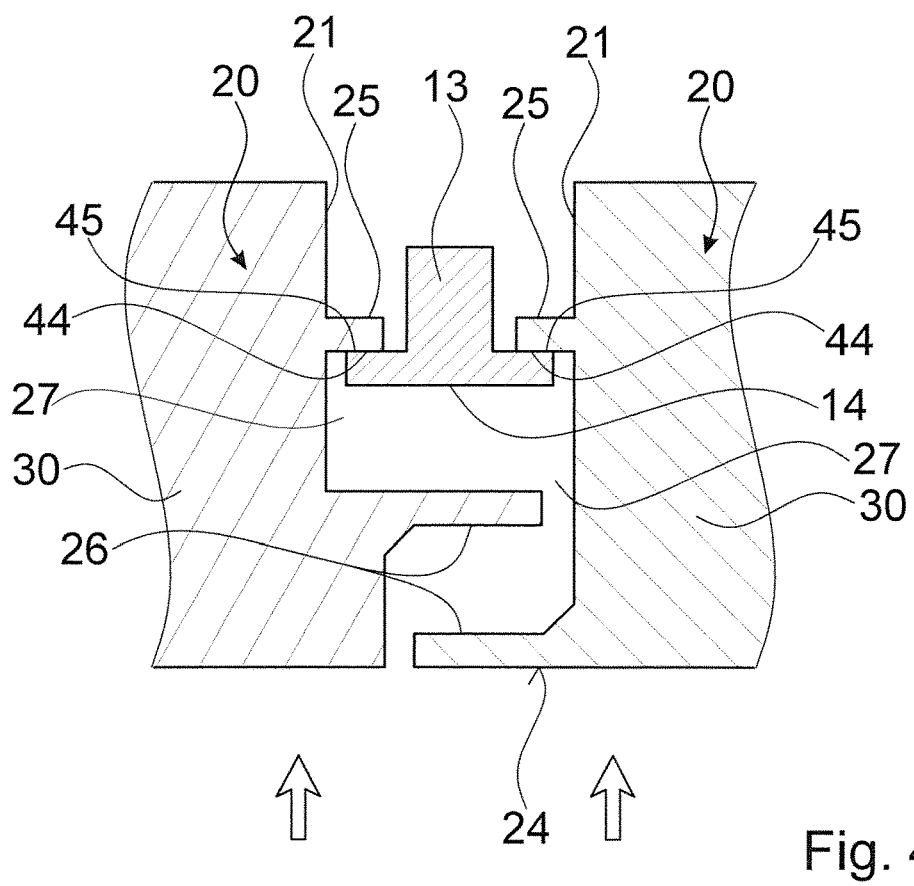
FIG. 4 is a fragmentary cross-sectional view of a peripheral region of two adjacent segments of the holding device of FIG. 1.

Two lateral peripheral regions 21 of two neighboring segments 20 are illustrated in a sectional manner in FIG. 4. Each segment 20 comprises a segment support structure 30. The lateral peripheral regions 21 of both segments 20 show the segment support structures 30 with projections 25 and recesses 27 in such a manner that bearing edges 44, 45 for bearing the segment 20 respectively are formed on the projections 25 and the crossbeam 14 of the support 13. The bearing edges 45 of the crossbeam 14 may be described as connection faces of the flange 10. The projections and recesses are embodied in such a manner that the intermediate space between both segments 20 is designed in a meandering manner or a labyrinth-like manner, and the support 13 when viewed from the lower side 24 of the segments 20 is not visible and is thus protected against unintentional coating, said lower side 24 in the exemplary embodiment being the coating side (illustrated by arrows). The bearing edges 44, in each case in conjunction with the crossbeam 14 of the associated support, form the holding structure 15 for the segments 20.

The shielding of the support 13 in relation to a coating also may be implemented in another way and while using other or additional components of the segments, for example, by overlapping protrusions 26 of at least one lower plate-shaped element and/or at least one segment support structure 30.

Figure 5A:
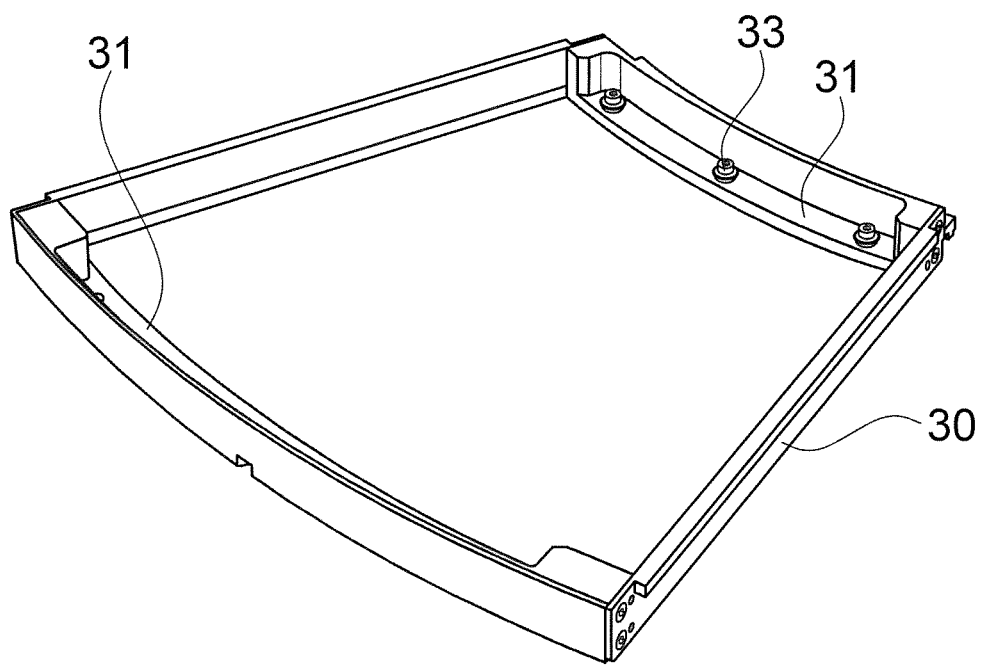
FIG. 5A is a perspective view of the support structure of the holding device of FIG. 3.

FIG. 5A shows a segment support structure 30 as can be used in FIG. 3. The segment support structure 30 at the lower and the upper peripheral portion, the latter in each case being formed by an arc, has further holding structure that serves for mounting the carrier 40 on the segment support structure 30 and is to be referred to as carrier holding structure 31. The carrier holding structure 31 is configured as horizontal faces having screw connectors 33. Other carrier holding structures alternatively may be used.

Figure 5B:
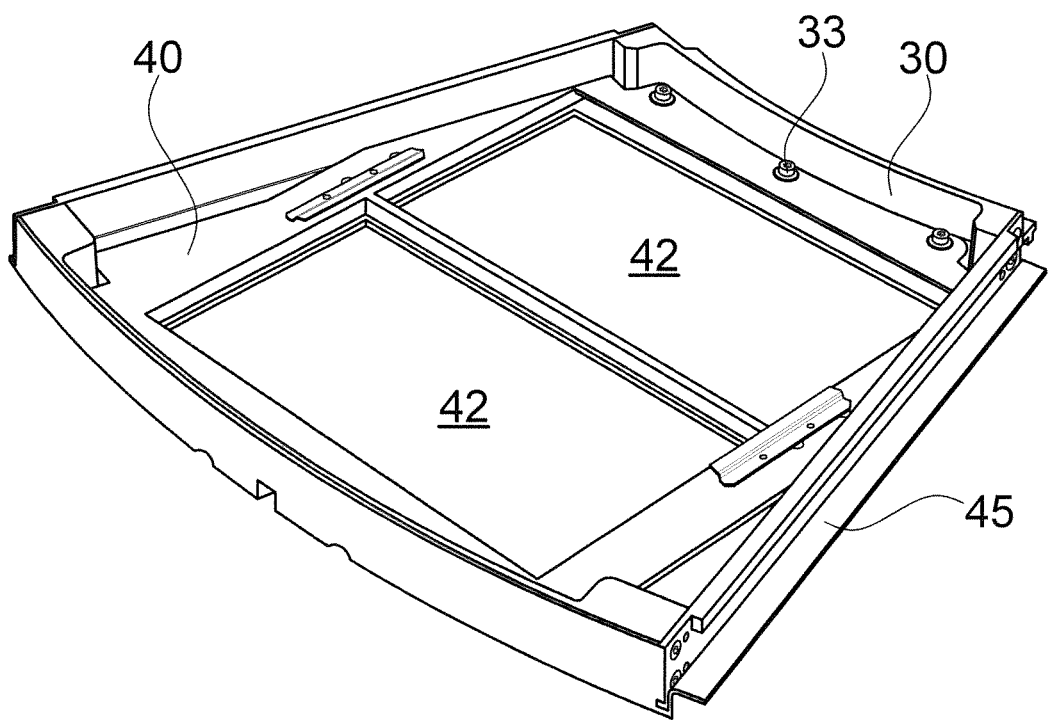
FIG. 5B is a perspective view of the support structure of FIG. 5A assembled with a carrier.

FIG. 5B shows the segment support structure 30 of FIG. 5A, complemented by a carrier 40, which is assembled on the screw connectors 33 and covers the segment support structure 30 on the lower side. The carrier 40 has a small edge fold 45 at the half-height level of the segment support structure 30. The edge fold 45 has the same shielding effect as the protrusion 26 in FIG. 4.

Figure 5C:
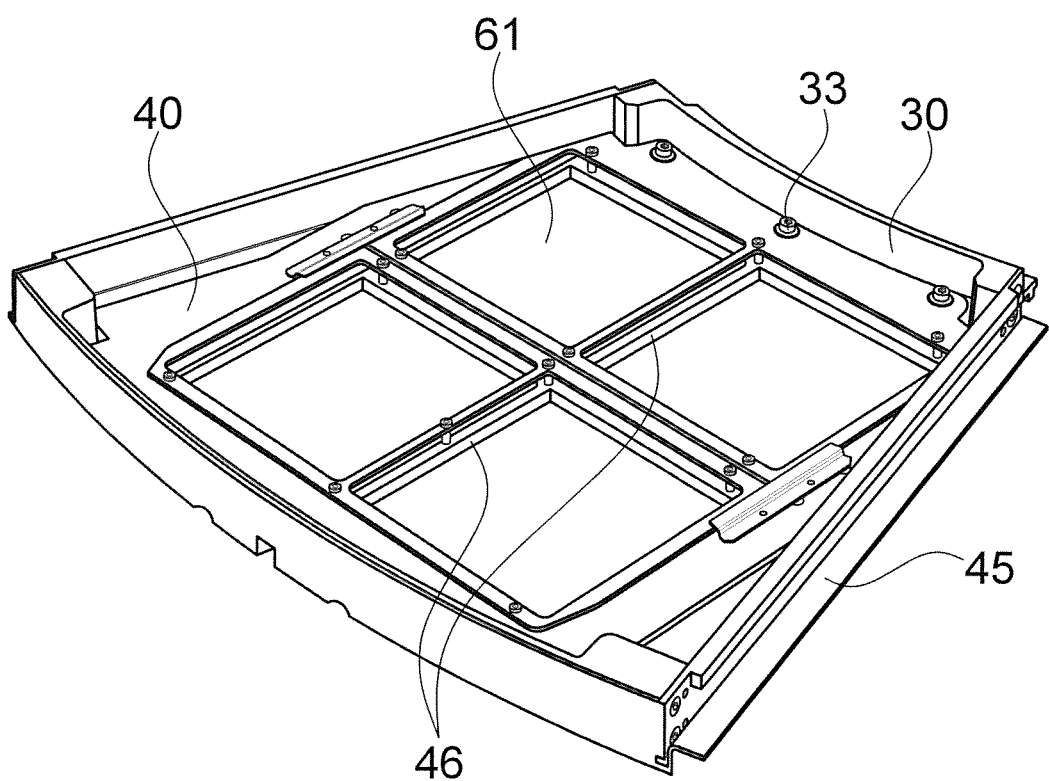
FIG. 5C is a perspective view of the assembly of FIG. 5B assembled with holding frames and substrates disposed therein.

The carrier 40 centrically has two quadrangular carrier openings 42, in each of which one pair of substrates 61 may be disposed by holding frames 46, as shown in FIG. 5C. The segments 20 thus equipped may be introduced into a treatment plant so as to be treated, for example coated, from below therein.

Figure 6:
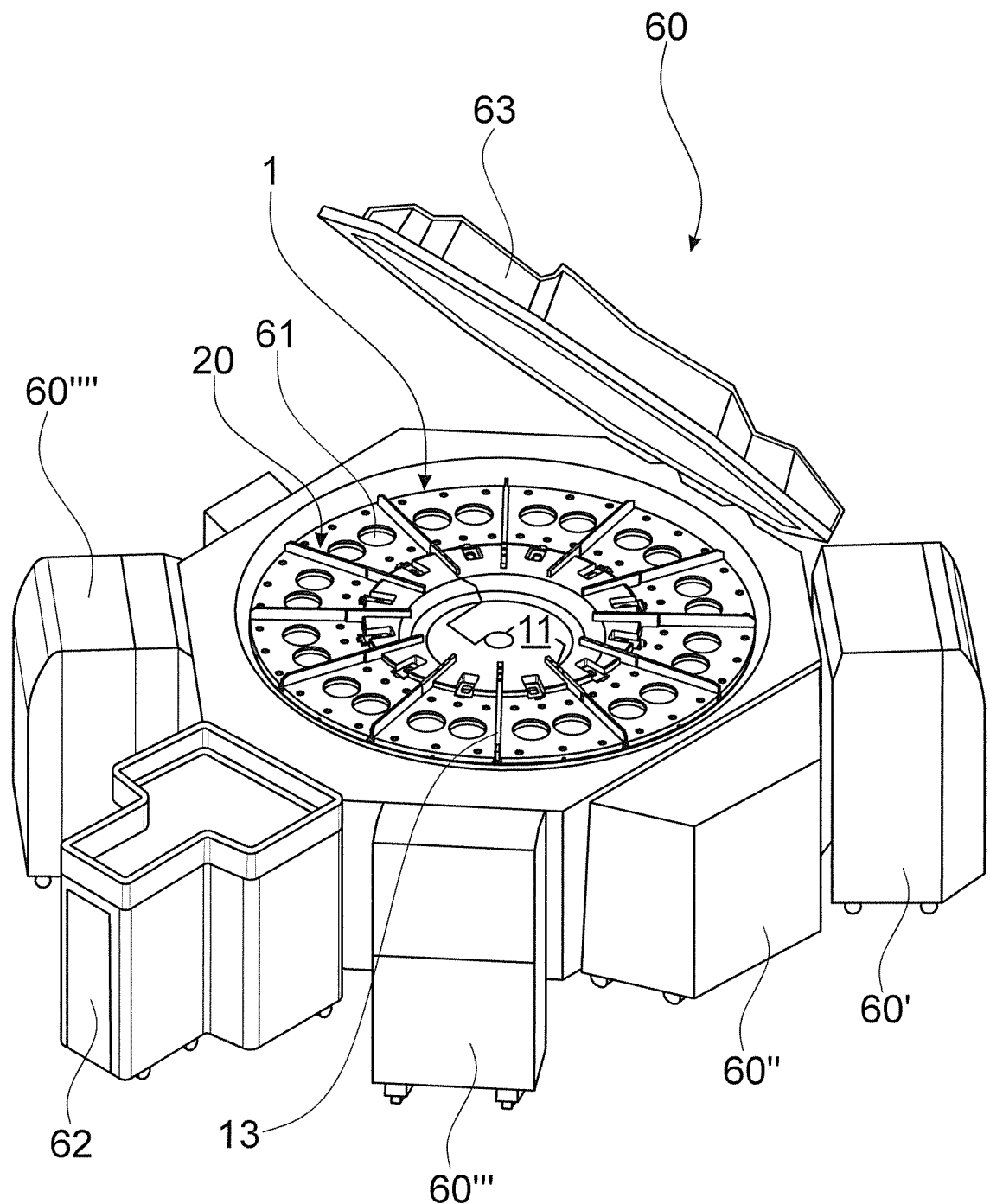
FIG. 6 is a perspective view of an example treatment system according to the present disclosure comprising the holding device of FIG. 1.

FIG. 6 shows an opened treatment plant, or system, 60 that uses a holding device 1 according to FIG. 1. In terms of the details of the holding device, reference is made to the explanations pertaining to FIG. 1 to FIG. 5C. The treatment plant 60 has a circular construction and has a plurality of sections, or stations, 60', 60'', 60''', and 60'''' that are distributed on the circumference of said treatment plant 60 and that serve directly or indirectly for treating substrates 61.

The substrates 61 are disposed in the segments 20 and are treated at at least one of the stations 60', 60'', 60''', or 60''''. The treatment plant 60 during the treatment is closed by a cover 63 of said treatment plant 60.

The holding device 1 is equipped with the segments 20. Magazines (not illustrated), in which segments 20 having substrates 61 are kept ready, are disposed in a loading station 62. The substrates 61, on account of a step-by-step rotation of the holding device 1 by a suitable substrate transport device that carries out the rotation, gradually pass through the individual stations 60', 60'', 60''', and 60'''', including the treatment station(s), such that the segments 20 having already treated substrates 61 may be retrieved at the loading station 62, and segments 20 having untreated substrates 61 may be assembled in the holding device 1.

Illustrative, non-exclusive examples of inventive subject matter according to the present disclosure are described in the following enumerated paragraphs:

A1. A holding device for receiving a plurality of substrates in a substrate treatment system, the holding device comprising:

a flange;

at least one segment that is releasably disposed on the flange, wherein the flange has connection faces for disposing the at least one segment on the flange, wherein the at least one segment has a segment support structure; and at least one carrier for receiving one or a plurality of substrates, said at least one carrier being assembled on the segment support structure.

A2. The holding device according to paragraph A1, wherein the at least one segment is loosely connected to the flange or is fastened so as to be non-destructively releasable on the flange.

A3. The holding device according to any of paragraphs A1-A2, wherein the flange, the at least one segment, or both has holding structure for mounting or for fastening, or mounting and fastening, the segment on the flange.

A4. The holding device according to paragraph A3, wherein the holding structure is disposed on the segment support structure.

A5. The holding device according to any of paragraphs A3-A4, wherein the at least one carrier, the segment support structure, or both, when the at least one carrier is mounted by the holding device, at least partially covers/cover the holding structure.

A6. The holding device according to any of paragraphs A1-A5, wherein the at least one carrier is loosely connected to the segment support structure or is fastened so as to be non-destructively releasable on the segment support structure.

A7. The holding device according to any of paragraphs A1-A6, wherein the at least one carrier is configured in multiple parts.

A8. The holding device according to any of paragraphs A1-A7, wherein the at least one carrier, the segment support structure, or both, when the at least one carrier is mounted by the holding device, at least partially covers the connection faces of the flange.

A9. The holding device according to any of paragraphs A1-A8, wherein the flange is configured as a circular plate having supports that are assembled radially on the plate, and wherein at least the supports comprise the connection faces.

A10. The holding device according to paragraph A9, wherein the segments are configured as annular segments.

B1. A treatment system for the treatment of substrates, the treatment system comprising:

at least one treatment chamber having at least one treatment section;

a substrate transport device, configured for moving substrates in the treatment system, wherein the substrate transport device comprises the holding device of any of paragraphs A1-A10

B2. The treatment system according to paragraph B1, wherein the at least one treatment section is a coating section for depositing a surface layer on the substrates.

B3. A method for treating substrates in the treatment system of any of paragraphs B1-B2, the method comprising:

providing substrates to be treated;

disposing the substrates on the at least one carrier;

assembling the at least one carrier, equipped with the substrates, on the segment support structure;

moving the segment support structure and the at least one carrier, equipped with the substrates, into the treatment chamber;

treating the substrates; and moving out the at least one segment and/or the at least one carrier having the treated substrates from the treatment chamber.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only (optionally including entities other than B); in another example, to B only (optionally including entities other than A); in yet another example, to both A and B (optionally including other entities). These entities may refer to elements, actions, structures, steps, operations, values, and the like.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

The invention claimed is:

1. A holding device for receiving a plurality of substrates in a substrate treatment system, the holding device comprising:
   a flange; and
   a plurality of segments that are releasably disposed on the flange, wherein the flange has connection faces for disposing the plurality of segments on the flange, wherein each segment of the plurality of segments comprises a segment frame supported atop the connection faces of the flange and at least one plate-shaped carrier separate from the frame for receiving a plurality of substrates, and wherein the at least one plate-shaped carrier is assembled on the segment frame;
   wherein the flange is configured as a circular plate having supports that are assembled radially on the plate, and wherein at least the supports comprise the connection faces; and
   wherein each segment frame comprises protrusions that extend beneath adjacent respective supports of the flange to shield the adjacent respective supports of the flange.

2. The holding device according to claim 1, wherein the plurality of segments are releasable on the flange.

3. The holding device according to claim 1, wherein the flange, the plurality of segments, or both have a holding structure for mounting the plurality of segments on the flange.

4. The holding device according to claim 3, wherein the holding structure is disposed on the segment frame.

5. The holding device according to claim 3, wherein the at least one plate-shaped carrier, the segment frame, or both, when the at least one plate-shaped carrier is mounted by the holding device, at least partially cover the holding structure.

6. The holding device according to claim 3, wherein the holding structure is configured to be remotely controlled between an open state and a closed state, in which the plurality of segments are held in radial positions on the flange.

7. The holding device according to claim 1, wherein the at least one plate-shaped carrier is configured in multiple parts.

8. The holding device according to claim 1, wherein the at least one plate-shaped carrier, the segment frame, or both, when the at least one plate-shaped carrier is mounted by the holding device, at least partially cover the connection faces on the flange.

9. The holding device according to claim 1, wherein the segments are configured as annular segments.

10. The holding device according to claim 1, wherein the at least one plate-shaped carrier comprises a holding frame for receiving the plurality of substrates.

11. The holding device according to claim 1, wherein the at least one plate-shaped carrier comprises webs that define openings for receiving the plurality of substrates.

12. A treatment system for the treatment of substrates, the treatment system comprising:
   at least one treatment chamber having at least one treatment section;
   a substrate transport device, configured for moving substrates in the treatment system, wherein the substrate transport device comprises a holding device that comprises:
   a flange; and
   a plurality of segments that are releasably disposed on the flange, wherein the flange has connection faces for disposing the plurality of segments on the flange, wherein each segment of the plurality of segments comprises a segment frame supported atop the connection faces of the flange and at least one plate-shaped carrier separate from the segment frame for receiving a plurality of substrates, and wherein the at least one plate-shaped carrier is detachably assembled on the segment frame;
   wherein the flange is configured as a circular plate having supports that are assembled radially on the plate, and wherein at least the supports comprise the connection faces; and
   wherein each segment frame comprises protrusions that extend beneath adjacent respective supports of the flange to shield the adjacent respective supports of the flange.

13. The treatment system according to claim 12, wherein the at least one treatment section is a coating section for depositing a surface layer on the substrates.

14. The holding device according to claim 12,
   wherein the flange, the plurality of segments, or both has a holding structure for mounting or for fastening, or mounting and fastening, the plurality of segments on the flange; and
   wherein the holding structure is configured to be remotely controlled between an open state and a closed state, in which the plurality of segments are held in radial positions on the flange.

15. The treatment system according to claim 12, wherein the at least one plate-shaped carrier comprises a holding frame for receiving the plurality of substrates.

16. The treatment system according to claim 12, wherein the at least one plate-shaped carrier comprises webs that define openings for receiving the plurality of substrates.

17. A holding device for receiving a plurality of substrates in a substrate treatment system, the holding device comprising:

a flange, wherein the flange comprises a central support plate and a plurality of elongate supports extending radially outward from the central support plate, and wherein each support of the plurality of elongate supports comprises a pair of upward-facing connection faces extending from opposed lateral sides of each support; and a plurality of segments, wherein each segment of the plurality of segments comprises:
  a segment frame;
  projections extending from the segment frame and that are releasably disposed on the upward-facing connection faces of the plurality of elongate supports; and
  a plate-shaped carrier for receiving a plurality of substrates, wherein the plate-shaped carrier is detachably assembled on the segment frame;

wherein the segment frame comprises protrusions that extend beneath adjacent supports of the flange to shield the supports.

18. The holding device according to claim 17, wherein the central support plate and the segment frame are planar and parallel to each other.

19. The holding device according to claim 17, wherein the plate-shaped carrier comprises a holding frame for receiving the plurality of substrates.

20. The holding device according to claim 17, wherein the plate-shaped carrier comprises webs that define openings for receiving the plurality of substrates.

21. A method of using the treatment system of claim 12, the method comprising:
  providing substrates to be treated;
  disposing the substrates on the at least one plate-shaped carrier;
  assembling the at least one plate-shaped carrier, equipped with the substrates, on the segment frame;
  moving the segment frame and the at least one plate-shaped carrier, equipped with the substrates, into the at least one treatment chamber;
  treating the substrates in the at least one treatment chamber to create treated substrates; and
  moving out the plurality of segments and/or the at least one plate-shaped carrier having the treated substrates from the at least one treatment chamber.

\* \* \* \* \*